(12) United States Patent
Peters et al.

(10) Patent No.: US 8,854,087 B2
(45) Date of Patent: Oct. 7, 2014

(54) ELECTRONIC CIRCUIT WITH A REVERSE CONDUCTING TRANSISTOR DEVICE

(71) Applicant: Infineon Technologies Austria AG, Villach (AT)

(72) Inventors: Dethard Peters, Hoechstadt (DE); Ralf Siemieniec, Villach (AT); Peter Friedrichs, Nuremberg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/631,275

(22) Filed: Sep. 28, 2012

(65) Prior Publication Data

US 2014/0091839 A1    Apr. 3, 2014

(51) Int. Cl.
*H03K 3/00* (2006.01)
(52) U.S. Cl.
USPC .......................................... 327/108; 327/112
(58) Field of Classification Search
USPC .................................................. 327/108–112
See application file for complete search history.

(56) References Cited

U.S. PATENT DOCUMENTS

| | | | | |
|---|---|---|---|---|
| 5,369,308 A * | 11/1994 | Schoofs et al. | ............... | 327/427 |
| 5,485,341 A * | 1/1996 | Okado et al. | ..................... | 361/98 |
| 6,466,060 B2 * | 10/2002 | Lee | ................................ | 327/108 |
| 7,205,822 B2 * | 4/2007 | Torres et al. | ................... | 327/427 |
| 7,746,614 B2 * | 6/2010 | Ishikawa et al. | ............. | 361/93.1 |

* cited by examiner

*Primary Examiner* — Kenneth B. Wells
(74) *Attorney, Agent, or Firm* — Slater & Matsil, L.L.P.

(57) ABSTRACT

An electronic circuit includes a first transistor device with a control terminal and a load path. A drive circuit includes an input terminal and an output terminal. The output terminal is coupled to the control terminal of the first transistor device. The drive circuit is operable to drive the first transistor device dependent on an input signal received at the input terminal. A polarity detector is coupled in parallel with the load path of the first transistor device. The polarity detector includes a second transistor device and a current detector. The second transistor device includes a load path connected to the load path of the first transistor device. The current detector includes a sense path in series with the load path of the second transistor device and an output connected to the input terminal of the drive circuit.

22 Claims, 3 Drawing Sheets

ELECTRONIC CIRCUIT WITH A REVERSE CONDUCTING TRANSISTOR DEVICE

TECHNICAL FIELD

Embodiments of the present invention relate to an electronic circuit with a transistor device, in particular a normally-on transistor device that has a reverse conducting capability.

BACKGROUND

Transistor devices, especially field-effect transistor devices, are widely used as electronic switches in a variety of electronic applications, such as automotive, industrial, household, or consumer electronic applications. In some applications it is desirable for the transistor device to have a reverse conducting capability. That is, the transistor device operates like a switch, that can be switched on and off, when a voltage with a first polarity (forward voltage) is applied between load terminals (drain and source terminals) of the transistor device, and the transistor device always conducts a current when a voltage with a second polarity (reverse voltage) is applied between the load terminals.

Some types of MOSFETs (Metal-Oxide-Semiconductor Field-Effect Transistors) and JFETs (Junction Field-Effect Transistors) have an internal diode (body diode) between the source and drain terminals. The internal body diode provides for the reverse conducting capability. However, the forward voltage of the internal diode causes losses when the transistor device is reverse conducting. Especially in transistor devices implemented with wide-bandgap semiconductor materials, such as SiC (silicon carbide) or GaN (Gallium nitride), the forward voltage and, therefore, the losses, are relatively high. The forward voltage of a SiC diode is about 3.5V, which is about five times the forward voltage of a Si (silicon) diode (which is about 0.7V).

There is therefore a need to provide an electronic circuit with a transistor device, in particular a normally-on transistor device, in which the transistor device has a reverse conducting capability and has low losses in the reverse conducting state.

SUMMARY OF THE INVENTION

A first embodiment relates to an electronic circuit. The electronic circuit includes a first transistor device with a control terminal and a load path, a drive circuit, and a polarity detector. The drive circuit includes an input terminal and an output terminal, with the output terminal being coupled to the control terminal of the first transistor device, and the drive circuit being operable to drive the first transistor device dependent on an input signal received at the input terminal. The polarity detector is coupled in parallel with the load path of the first transistor device and includes a second transistor device, and a current detector. The second transistor device includes a load path connected to the load path of the first transistor device, and the current detector includes a sense path in series with the load path of the second transistor device, and an output connected to the input terminal of the drive circuit. The current detector is operable to generate an on-level of the input signal when a current through the second transistor device has a predefined current direction.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced.

Figure 1:
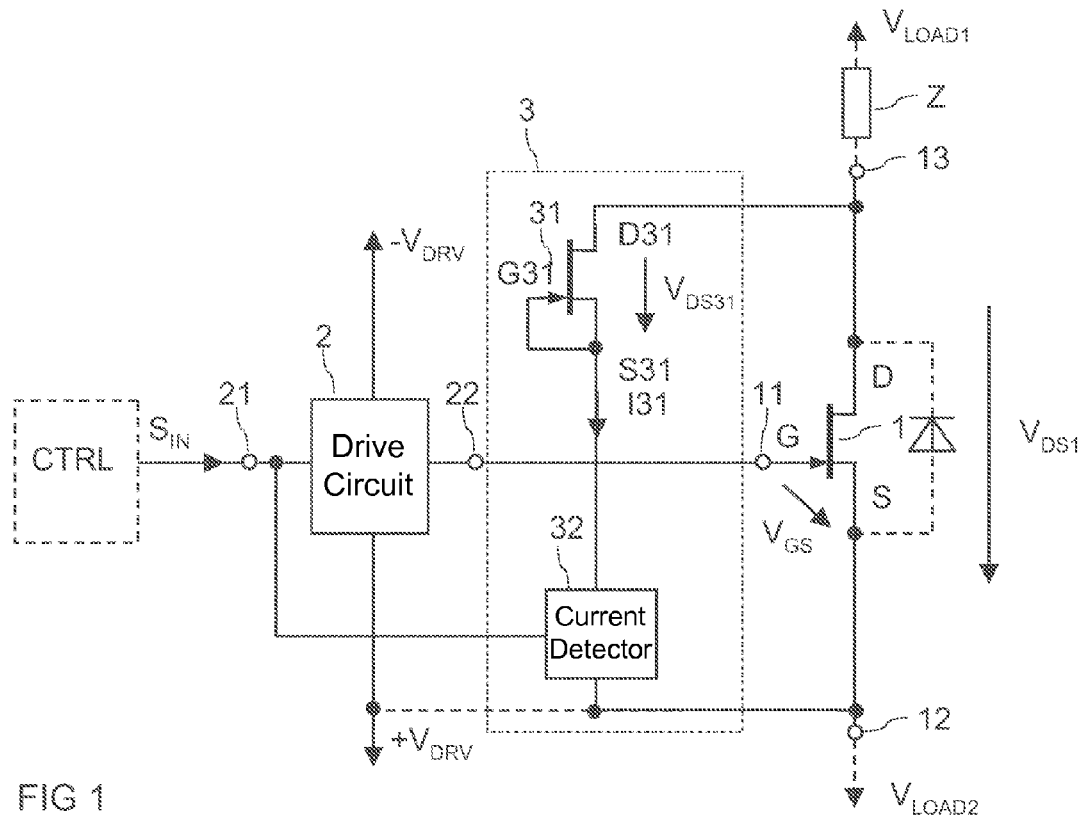
FIG. 1 illustrates one embodiment of an electronic circuit including a first transistor device, a drive circuit, and a polarity detector with a second transistor device and a current detector.

FIG. 1 illustrates one embodiment of an electronic circuit that includes a first transistor device with a control terminal 11 and load path between a first load terminal 12 and second load terminal 13. In the present embodiment, the transistor device is a normally-on transistor device, specifically an n-type JFET. However, this is only an example. The first transistor device 1 could be implemented as an n-type depletion MOSFET, or a HEMT (High-Electron-Mobility Transistor) as well (which can be considered as a specific type of field-effect transistor). The electronic behavior of a HEMT corresponds to the electronic behavior of a JFET. Although the first transistor device of FIG. 1 is implemented as an n-type normally-on transistor, the electronic circuit could be implemented with a p-type normally-on transistor as well. In this case, the polarities of the voltages and currents explained in the following have to be inverted and transistor devices explained in the following have to be replaced by complementary transistor devices.

In the n-type JFET 1 of FIG. 1, the control terminal 11 is a gate terminal G, the first load terminal 12 is a source terminal S, and the second load terminal 13 is a drain terminal D. In the electronic circuit of FIG. 1, it is desired for the first transistor device 1 to operate as an electronic switch when a load-path voltage (drain-source voltage) $V_{DS1}$ has a first polarity. The first transistor device 1 operates as an electronic switch when a switching state of the transistor device 1 is dependent on a drive voltage received at the gate terminal G. The drive voltage of the JFET of FIG. 1 is a gate-source voltage $V_{GS}$, that is a voltage between the gate terminal G and the source terminal S. The first transistor device 1 is in an on-state (conducting state) when the drive-voltage (gate-source voltage) $V_{GS}$ has an on-level, and is in an off-state (blocking state) when the drive voltage has an off-level. In case of the n-type JFET of FIG. 1, the gate-source voltage $V_{GS}$ has an on-level when the gate-source voltage $V_{GS}$ is higher than a pinch-off voltage, and the gate-source voltage $V_{GS}$ has an off-level when the gate-source voltage $V_{GS}$ is at or below the pinch-off voltage. In an n-type JFET, the pinch-off voltage is a negative voltage, such as, e.g., between −25V and −5V. A load-path voltage $V_{DS1}$ with the first polarity corresponds to a positive drain-source voltage $V_{DS1}$ in the JFET of FIG. 1.

Further, it is desired for the first transistor device 1 to conduct a current, independent of a signal level of the drive voltage (gate-source voltage) $V_{GS}$, when the load-path voltage $V_{DS1}$ has a second polarity. A load-path voltage $V_{DS1}$ with the second polarity corresponds to a negative drain-source voltage in the n-type JFET 1 of FIG. 1.

An operation mode in which the load-path voltage $V_{DS1}$ has the first polarity will be referred to as forward-biased mode of the transistor device 1 in the following, and an operation mode in which the load-path voltage $V_{DS1}$ has the second polarity and will be referred to as reverse-biased mode in the following. Referring to FIG. 1, the first transistor device 1 may be used as an electronic switch for switching a current through a load Z connected in series with the load-path of the first transistor device 1. The series circuit with the first transistor device 1 and the load Z is connected between voltage supply terminals. The load-path voltage $V_{DS1}$ across the first transistor device results from a supply voltage that is applied to the series circuit with the load Z and the first transistor device 1.

The first transistor device 1 may include an internal diode (body diode) that is illustrated in dashed lines in FIG. 1. In an n-type transistor device, such as an n-type JFET (as illustrated in FIG. 1) or an n-type depletion MOSFET, the internal diode has an anode terminal corresponding to the source terminal S and a cathode terminal corresponding to the drain terminal D. Thus, the internal diode conducts a current whenever a negative drain-source voltage (positive source-drain voltage) $V_{DS31}$ higher than the forward voltage of the diode is applied to the transistor device. In this case, the current I31 is a negative drain-source current. Thus, the internal diode provides for a reverse conducting capability of the transistor device. However, the forward voltage of the diode causes losses. These losses increase as the current in the reverse direction increases. Further, the higher these losses are, the higher the forward voltage is. For example, the forward voltage of the internal diode in a silicon (Si) transistor device is about 0.7V, while the forward voltage of the internal diode in a transistor device implemented with a wide band gap semiconductor material, such as SiC or GaN is significantly higher.

In order to reduce those losses, when the first transistor device 1 is in the reverse-biased mode, it is desired to switch on the first transistor device 1 when the first transistor device 1 is in the reverse-biased mode. In this way, the internal body diode is bypassed. Besides a reduction of the losses, this further prevents problems that may occur in connection with reverse-recovery effects in the internal diode which are caused by injected minority carriers.

Referring to FIG. 1, the electronic circuit further includes a drive circuit 2 including an input terminal 21 and an output terminal 22. The output terminal 22 is connected to the control terminal 11 (gate terminal G) of the first transistor device 1, and the drive circuit 2 is operable to drive the first transistor device 1 dependent on an input signal $S_{IN}$ received at the input terminal 21. That is, the drive circuit 2 generates an on-level of the drive voltage $V_{GS}$ when the input signal $S_{IN}$ has an on-level, and the drive circuit 2 generates an off-level of the drive voltage $V_{GS}$ when the input signal $S_{IN}$ has an off-level. The drive circuit 2 generates the drive voltage $V_{GS}$ from a supply voltage received at supply terminals of the drive circuit 2. The supply voltage is a voltage between a negative drive potential $-V_{DRV}$ and a positive drive potential $+V_{DRV}$ in the present embodiment. These drive potentials $-V_{DRV}$, $+V_{DRV}$ are, e.g., referenced to the first load terminal 12 (first terminal S of the first transistor device 1). According to one embodiment, the negative drive potential $-V_{DRV}$ is below the pinch-off voltage of the first transistor device 1 so that the negative drive potential $-V_{DRV}$, when applied to the control terminal 11, switches off the first transistor device 1, while the positive drive potential $+V_{DRV}$ is above the pinch-off voltage, so that the positive drive potential $+V_{DRV}$ switches on the first transistor device 1 when applied to the control terminal 11. According to one embodiment, the drive circuit 2 switches the negative drive potential $-V_{DRV}$ to the output terminal 22, so as to switch off the first transistor device 1 when the input signal $S_{IN}$ has an off-level, and switches the positive drive potential $+V_{DRV}$ to the output terminal 22 when the input signal $S_{IN}$ has an on-level.

Referring to FIG. 1, the electronic circuit further includes a polarity detector 3 connected in parallel with the load path of the first transistor device 1. The polarity detector includes a second transistor device 31, and a current detector 32. The second transistor device 31 includes a load path connected to the load path of the first transistor device 1. The current detector includes a sense path in series with the load path of the second transistor device 31 and an output connected to the input terminal 21 of the drive circuit 2.

The polarity detector 3 is operable to detect a polarity of the load-path voltage $V_{DS1}$. When the load-path voltage $V_{DS1}$ has the first polarity, the polarity detector 3, in particular the current detector 32, does not affect the signal level of the input signal S. In this case, the signal level of the input signal $S_{IN}$ is only defined by a control circuit CTRL (illustrated in dashed lines in FIG. 1), such as a microcontroller. Thus, in the forward-biased mode of the first transistor device 1 a switching operation of the first transistor device 1 is only defined by the control circuit CTRL. When, however, the polarity detector 3 detects that the load-path voltage $V_{DS1}$ has the second polarity, the polarity detector 3, in particular the current sensor 32, sets the signal level $S_{IN}$ to an on-level, thereby overriding a signal level generated by the control circuit CTRL, in order to switch on the first transistor device 1 as long as there is the second polarity of the load-path voltage $V_{DS1}$.

Figure 3:
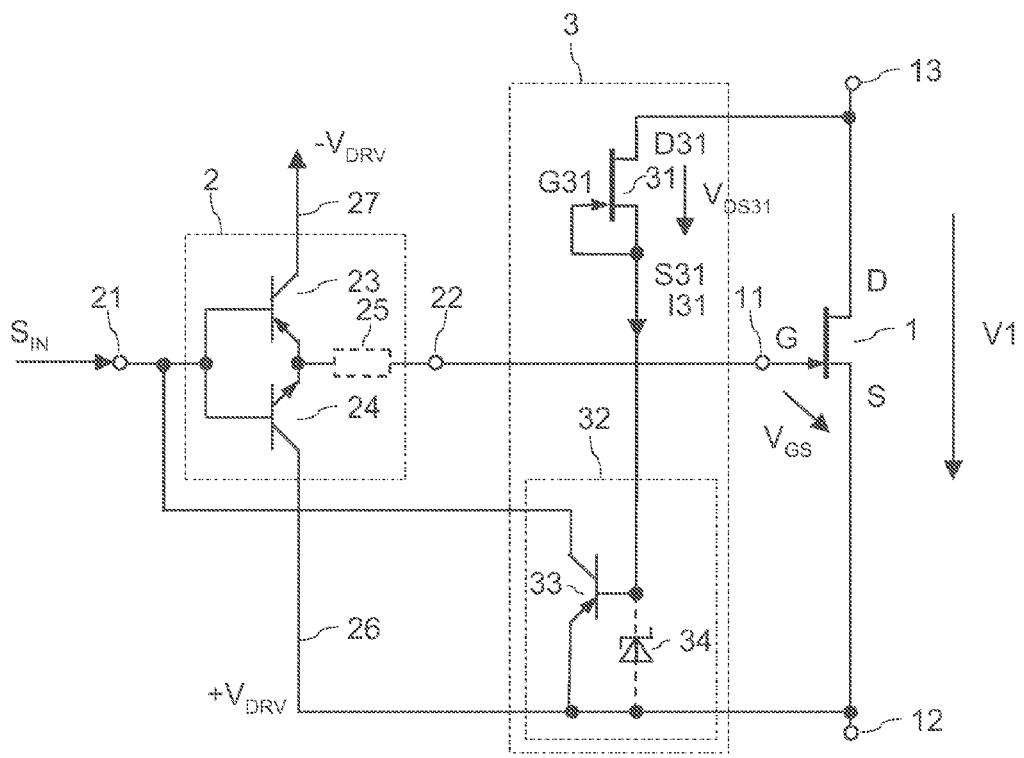
FIG. 3 illustrates the electronic circuit of FIG. 1, with an embodiment of the drive circuit and a first embodiment of the polarity detector being illustrated in detail.

In the polarity detector of FIG. 3, the current I31, in particular a direction of the current I31, through the second transistor device 31 is dependent on the polarity of the load-path voltage $V_{DS1}$. The current detector 32 detects the current direction of this current I31 and generates the on-level of the input signal $S_{IN}$ when the current I31 through the second transistor device 31 has a predefined current direction. This is explained in greater detail herein below.

Figure 2:
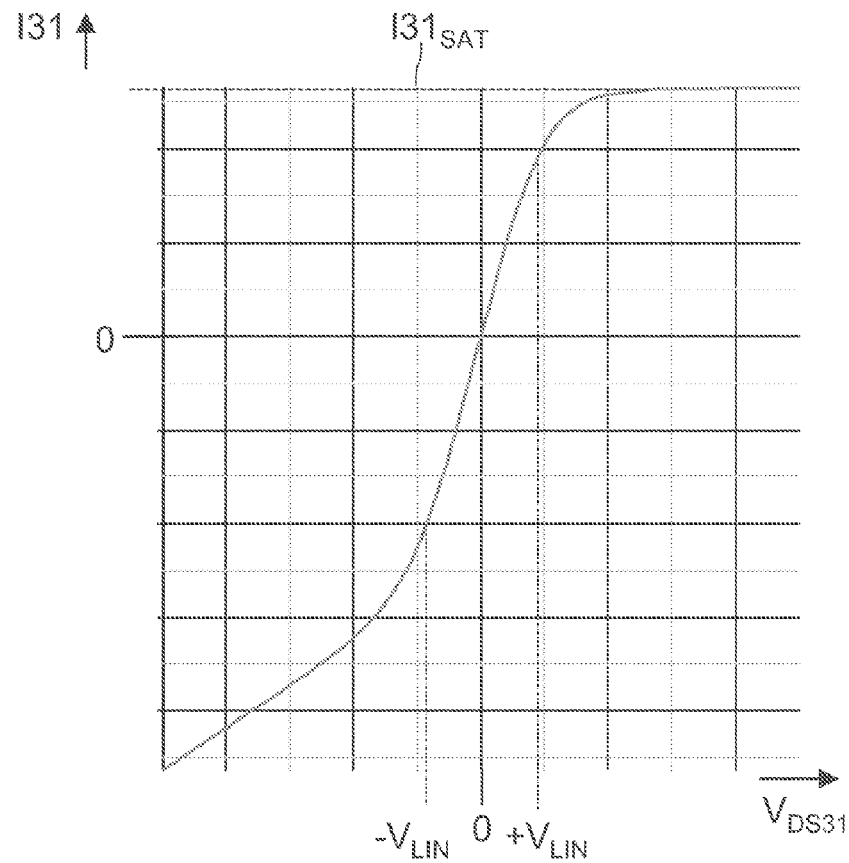
FIG. 2 schematically illustrates a characteristic curve of one embodiment of a second transistor device implemented in the polarity detector.

According to one embodiment, the first transistor device 1 and the second transistor device 31 are transistors of the same transistor type. That is, the first transistor device 1 and the second transistor device 31 are n-type JFETs in the embodiment of FIG. 1. In the embodiment of FIG. 1, the second transistor device 31 has a first load terminal (source terminal) S31 coupled to the current detector 32 and has a second load terminal (drain terminal) D31 connected to the second load terminal 13 (drain terminal D) of the first transistor device 1. Further, a control terminal (gate terminal) G31 of the second transistor device 31 is connected to the first load terminal (source terminal) S31 of the second transistor device 31. The operating principle of the second transistor device 31, when implemented as an n-type JFET, is illustrated in FIG. 2. FIG. 2 shows the current I31 through the second transistor device 31 dependent on the load-path voltage (drain-source voltage $V_{DS31}$) of the second transistor device 31. Referring to FIG. 2, the current I31 has a first polarity (a first direction) when the load-path voltage $V_{DS31}$ has a first polarity, and the current I31 has a second polarity (second direction) when the load-path voltage $V_{DS31}$ has the second polarity. According to one embodiment, the first polarity of the load-path voltage $V_{DS31}$ corresponds to the polarity illustrated in FIG. 1, and the first direction of the current I31 corresponds to the direction illustrated in FIG. 1. That is, the current I31 flows in the direction (first direction) as illustrated in FIG. 1 when the load-path voltage $V_{DS31}$ has the polarity (first polarity) illustrated in FIG. 1, and the current flows in the opposite direction when the load-path voltage $V_{DS31}$ has the opposite polarity. The load-path-voltage $V_{DS31}$ with the first polarity illustrated in FIG. 1 will be referred to as a positive drain-source voltage of the second transistor device 31, and the corresponding current I31 will be referred to as a positive drain current (drain-source current). Consequently, a load-path voltage with the second polarity will be referred to as negative drain-source voltage, and the corresponding current will be referred to as negative drain current. The gate-source voltage of the second transistor device 31 is zero because the gate and source terminals G, S are connected.

Referring to FIG. 2 and referring to the explanation before, the current direction of the current I31 is dependent on the polarity of the load-path voltage $V_{DS31}$. The current I31 is positive when the load-path voltage $V_{DS31}$ is above zero, and the current I31 is negative when the load path voltage $V_{DS31}$ is below zero. In the embodiment of FIG. 2, the characteristic curve includes a linear region in which the load current I31 is essentially proportional to the load path voltage $V_{DS31}$. The linear region includes load-path voltages $V_{DS31}$ between $-V_{LIN}$ and $+V_{LIN}$, $-V_{LIN}$ and $+V_{LIN}$ are dependent on the specific type of transistor device. According to an embodiment, $-V_{LIN}$ is about $-10V$, while $+V_{LIN}$ is about $10V$. At load-path voltages $V_{DS31}$ higher than $+V_{LIN}$ the load current I31 approaches (is limited to) a saturation current $I31_{SAT}$. That is, a further increase of the load-path voltage $V_{DS31}$ does not result in a further increase of the load current I31 in this region of the characteristic curve, until a maximum voltage (breakdown voltage) is reached. At load path voltages below $-V_{LIN}$ the magnitude of the load current I31 further increases as the magnitude of the load-path voltage $V_{DS31}$ further increases. A slope of the current curve in this region may be smaller than in the linear region. However, this is dependent on the specific type of transistor, so that there may be JFETs in which the current slope is higher in the region than in the linear region.

The different regions of the characteristic curve will again be explained with reference to one specific embodiment of a second transistor device 31 implemented as an n-type JFET illustrated in FIG. 5.

In the embodiment of FIG. 1, the load-path voltage of the second transistor device 31 has the first polarity (the polarity illustrated in FIG. 1) when the load-path voltage of the first transistor device 1 has the first polarity (the polarity illustrated in FIG. 1). That is, the load-path voltage $V_{DS31}$ of the second transistor device 1 has the first polarity when the first transistor device 1 is forward biased, while the load-path voltage of the second transistor device 1 has the second polarity when the first transistor device 1 is reverse biased. The current detector 32 sets the input signal $S_{IN}$ of the drive circuit 2 to the on-level whenever the current I31 through the second transistor device 32 has the second polarity, that is when the first transistor 1 is reverse biased.

FIG. 3 illustrates the electronic circuit of FIG. 1, wherein embodiments of the drive circuit 2 and the current detector 32 are illustrated in detail. Referring to FIG. 3, the driver circuit 3 has a push-pull output driver configuration. That is, the drive circuit 2 includes a half-bridge with a first transistor 23 and a second transistor 24 that have their load-paths connected in series between the terminal 27 for the negative drive potential $-V_{DRV}$ and the terminal 26 for the positive drive potential $+V_{DRV}$. In this embodiment, the positive drive potential $+V_{DRV}$ corresponds to the source-potential of the first transistor device 1, which is the electrical potential at the source terminal S of the first transistor device 1. In the drive circuit of FIG. 3, both the first transistor 23 and the second transistor 24 are implemented as bipolar junction transistors (BJTs), wherein the first transistor 23 is a pnp transistor and the second transistor 24 is an npn transistor in the present embodiment. The load-path (collector-emitter path) of the first transistor 23 is connected between the output 22 and the terminal for the negative supply potential $-V_{DRV}$, and the load-path (collector-emitter path) of the second transistor 24 is connected between the output terminal 22 and the terminal for the positive drive potential $+V_{DRV}$. The emitter terminal of the first transistor 23 is connected to the emitter terminal of the second transistor 24 and is coupled to the output 22. Optionally, a resistive element 25 is connected between the circuit node common to the load-paths of the first and second transistors 23, 24 and the output 22. Control terminals (base terminals) of the first and second transistors 23, 24 are connected to the input terminal 21 of the drive circuit 2.

According to one embodiment, the signal level of the input signal $S_{IN}$ corresponds to the signal level of either the negative supply potential $-V_{DRV}$, or of the positive supply potential $+V_{DRV}$, and the signal level at drive signal $V_{GS}$ at the output 22 corresponds to the signal level of the input signal $S_{IN}$. In this case, the drive circuit 2 works as a push-pull driver that has a low output impedance (lower than the source providing the input signal $S_{IN}$).

The operating principle of the drive circuit 2 of FIG. 3 is as follows. When the input signal $S_{IN}$ corresponds to the positive supply potential $+V_{DRV}$ the voltage between collector and base of the second transistor 24 is zero and the second transistor 24 operates like a diode that couples the terminal 26 for the positive supply terminal $+V_{DRV}$ to the output 22, so that the potential at the output 22 corresponds to the positive supply potential $+V_{DRV}$. The first transistor 23 is switched off when the input signal $S_{IN}$ corresponds to the positive supply potential $+V_{DRV}$. In the embodiment of FIG. 3, the positive drive potential corresponds to the source potential of the first transistor device 1, so that the drive signal $V_{GS}$ is about zero in this case. Since a signal level of the input signal $S_{IN}$ corresponding to the positive supply potential $+V_{DRV}$ causes a drive signal $V_{GS}$ corresponding to the positive supply potential $+V_{DRV}$ and since the positive supply potential $+V_{DRV}$ switches on the first transistor device 1, a signal level of the input signal $S_{IN}$ corresponding to the positive supply potential $+V_{DRV}$ corresponds to an on-level of the input signal $S_{IN}$.

When the input signal $S_{IN}$ corresponds to the negative supply potential $-V_{DRV}$ the voltage between collector and base of the first transistor 23 is zero and the first transistor 23 operates like a diode that couples the terminal 27 for the negative supply terminal $-V_{DRV}$ to the output 22, so that the potential at the output 22 corresponds to the negative supply potential $-V_{DRV}$. The second transistor 24 is switched off when the input signal $S_{IN}$ corresponds to the negative supply potential $-V_{DRV}$. The negative supply potential $-V_{DRV}$ is referenced to the source terminal S of the first transistor device and switches off the first transistor device 1 when applied to the gate terminal G. The absolute value is dependent on the specific type of the first transistor device 1. According to one embodiment, the negative supply potential $-V_{DRV}$ is between $-15V$ and $-25V$ relative to the source potential. Since a signal level of the input signal $S_{IN}$ corresponding to the negative supply potential $-V_{DRV}$ causes a drive signal $V_{GS}$ corresponding to the negative supply potential $-V_{DRV}$ and since the negative supply potential $-V_{DRV}$ switches off the first transistor device 1, a signal level of the input signal $S_{IN}$ corresponding to the negative supply potential $-V_{DRV}$ corresponds to an off-level of the input signal $S_{IN}$.

Although the push-pull driver 2 is implemented with bipolar transistors in the embodiment of FIG. 3, the driver could be implemented with other types of transistors, such as field-effect transistors, as well.

Referring to FIG. 3, the current detector 32 includes a third transistor 33 that is implemented as a pnp bipolar junction transistor in the present embodiment. A base-emitter path of this transistor 33 forms a sense current path (control current path). The collector-emitter path (load current path) of the third transistor 33 is connected between the input 21 of the drive circuit 2 and the terminal for the positive drive potential $+V_{DRV}$. The third transistor 33 switches on, when the current I31 through the second transistor device 31 has the second current direction, that is when the first transistor device is reverse biased. This current I31 corresponds to the base current of the transistor 33. When the transistor 33 switches on, the input terminal 21 of the drive circuit 2 is connected to the positive drive potential $+V_{DRV}$, corresponding to an on-level of the input signal $S_{IN}$, so that the second transistor 24 switches on and connects the positive drive potential $+V_{DRV}$ to the output terminal 22, so as to switch on the first transistor device 1. However, the transistor 33 of the current detector 32 is switched off when the first transistor device 1 is forward biased. The base current of the transistor 33 is zero in this case, so that the current through the polarity detector 3 is zero when the transistor device 1 is forward biased.

Optionally, a voltage limiting element, such as a Zener diode, is connected between the base and emitter terminals of the transistor 33 of the current detector. The voltage limiting element is configured to limit the voltage between the base and emitter terminal to a predefined voltage limit when the first transistor device is forward biased.

The voltage blocking capability of the first transistor device 1 may be in the range of several hundred volts, such as 600V. The Zener voltage (breakthrough voltage) of the Zener diode 34 is lower than the base-emitter breakthrough voltage of the transistor 33. The Zener voltage is, e.g., several volts up to several ten of volts. In case the Zener diode 34 is conducting a current in the reverse direction and in case the first transistor device 1 is blocking so that the load-path voltage $V_{DS}$ is several hundred volts, the voltage drop across the second transistor device 31 corresponds to $V_{DS}$-$V_{ZENER}$, where $V_{ZENER}$ is the Zener voltage of the Zener diode 34. The voltage blocking capability of the second transistor device 31 may in the same range as the voltage blocking capability of the first transistor device 1.

Figure 4:
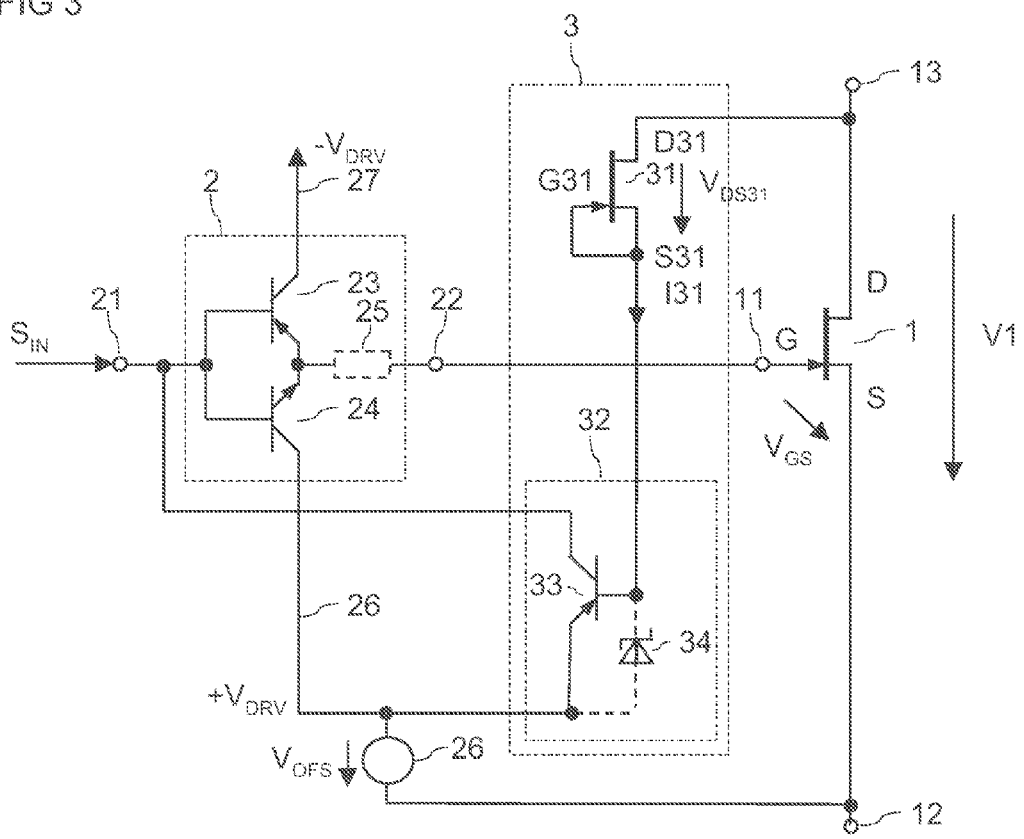
FIG. 4 illustrates the electronic circuit of FIG. 1, with an embodiment of the drive circuit and a second embodiment of the polarity detector being illustrated in detail.

FIG. 4 illustrates an electronic circuit according to a further embodiment. The electronic circuit of FIG. 4 is different from the electronic circuit of FIG. 3 in that the positive drive potential $+V_{DRV}$ does not correspond to the source potential, but is offset from the source potential by an offset voltage $V_{OFS}$ generated by an offset voltage source 26. The offset voltage $V_{OFS}$ is, e.g., a voltage of between 1V and 5V.

According to one embodiment, the first transistor device 1 and the second transistor device 31 are integrated in a common semiconductor body 100. One embodiment of a semiconductor body 100 in which the first transistor device 1 and the second transistor device 31 are commonly integrated is illustrated in FIG. 5. FIG. 5 illustrates a vertical cross sectional view of this semiconductor body 100.

The first transistor device 1 may include a plurality of transistor cells 10 connected in parallel. One such transistor cell 10 is illustrated in FIG. 5. The transistor cell 10 includes a source region 41 connected to a source electrode 81, a channel region 42 adjoining the source region 41, a drift region 43 and a drain region 44. The source region 41, the channel region 42, the drift region 43 and the drain region 44 have a first doping type, which is an n-type in an n-type JFET. The source electrode 81 is connected to or forms a source terminal S of the first transistor device 1. The drain region 44 is coupled to a drain terminal D (that is only schematically illustrated) of the first transistor device 1. The channel region 42 is located between a first gate region 51 that is electrically connected to a gate electrode 82 and a second gate region 52 that is electrically connected to the source electrode 81. In the present embodiment, the channel region 42 essentially extends in a horizontal direction of the semiconductor body 100 between the source region 41 and the drift region 43, wherein the drift region 43 is arranged between the channel region 42 and the drain region 44 in a vertical direction of the semiconductor body 100. The horizontal direction of the semiconductor body 100 is essentially a direction parallel to a first surface 101 of the semiconductor body 100, while the vertical direction is a direction perpendicular to the first surface 101. The first and second gate regions 51, 52 are doped regions of a second doping type complementary to the first doping type. The second gate region 52 adjoins the drift region 43. A pn-junction formed between the second gate region 52, that is connected to the source terminal S, and the drift region 43 forms an internal diode (body diode) of the JFET between the source terminal S and the drain terminal D.

The source electrode 81 is electrically insulated from the first gate region 51 by an insulation layer 91. The channel regions 42 of the individual transistor cells are electrically connected to the gate electrode 82 through a connection region 53 of the second doping type. The connection region 53 may have a higher doping concentration than the channel regions 51. The gate electrode 82 forms or is connected to the gate terminal G of the first transistor device 1.

The individual transistor cells of the first transistor device 1 share the drift region 43 and the drain region 44. Further, the channel region 51 may be implemented as one horizontal semiconductor region that includes vias or contact plugs that connect the individual source regions 64 to the source electrode 81. FIG. 5 shows a vertical cross section of one of those contact plugs 84.

Figure 5:
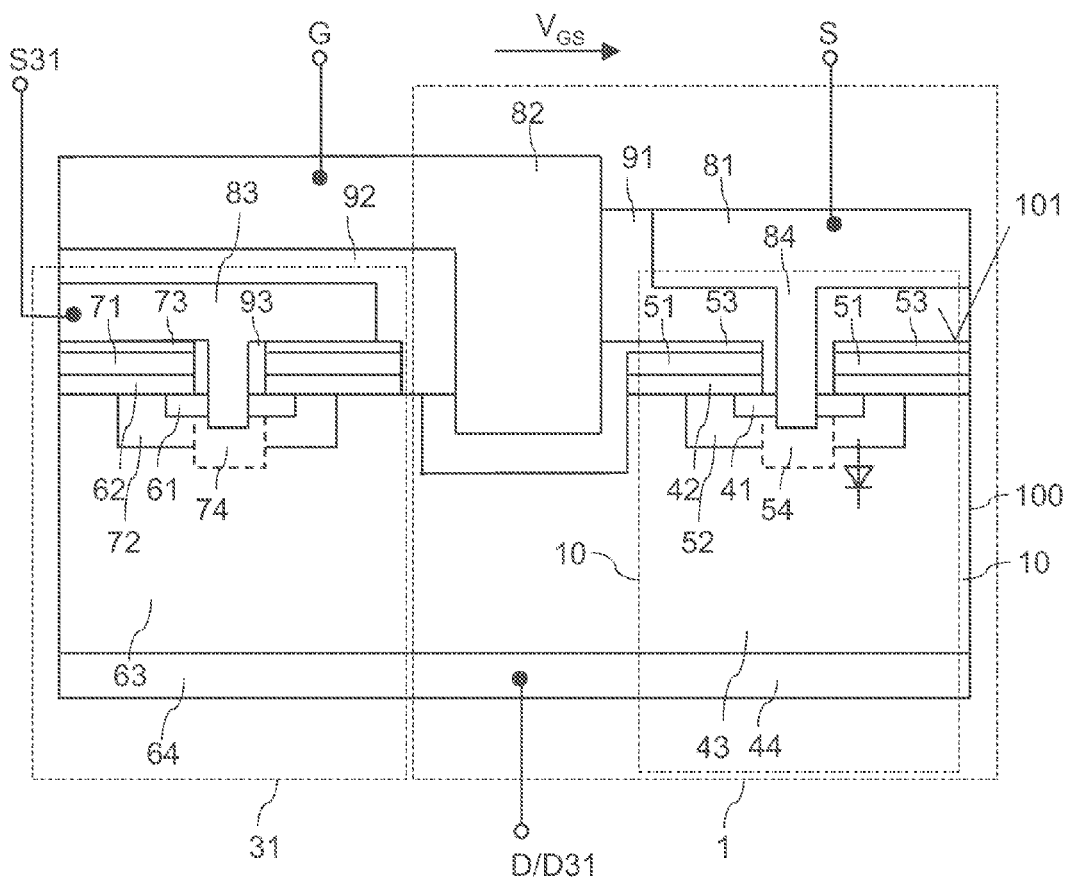
FIG. 5 illustrates a vertical cross sectional view of a semiconductor body in which the first transistor device and the second transistor device are integrated.

The operating state of the transistor device 1 of FIG. 5 can be controlled by the gate-source voltage $V_{GS}$. The first transistor device 1 is in an off-state, when the gate-source voltage $V_{GS}$ pinches off a conducting channel in the channel region 42, that is when the gate-source voltage $V_{GS}$ causes a depletion region in the channel region 42 that extends through the channel region 42 from the first gate region 51 to the second gate region 52. The magnitude of the pinch-off voltage is, inter alia, dependent on the distance between the first and second gate regions 51, 52 and the doping concentration of the channel region 42. In an n-type JFET, in which the channel region 42 is an n-type region, the pinch-off voltage is a negative gate-source voltage $V_{GS}$. The first transistor device 1 is in an on-state, when the gate-source voltage $V_{GS}$ is such that there is a conducting channel in the channel region between the source region 41 and the drift region 43.

Referring to FIG. 5, the second transistor device 31 may be implemented within at least one transistor cell similar to one transistor cell 10 of the first transistor device 1. Referring to FIG. 5, the transistor cell of the second transistor device 31 includes a drain region 64 connected to a drain terminal D31, and a drift region 63. The first transistor device 1 and the second transistor device 31 share the drift region, that is, have the drift region in common. Further, the drain region 64 and the drain terminal D31 of the second transistor device 31 correspond to the drain region 44 and the drain terminal D, respectively, of the first transistor device 1. Further, the at least one transistor cell of the second transistor device 31 includes a gate and source electrode 83, a first gate region 71 connected to the gate and source electrode 83 through a connection region 73, and a second gate region 72 connected to the gate and source electrode 83. The gate and source electrode 83 is electrically insulated from the channel region 71 by an insulation layer 93 and is electrically insulated from the gate electrode 82 of the first transistor device 1 by a further insulation layer 92. The at least one transistor cell of the second transistor device 31 may be located below a section of the gate electrode 82 of the first transistor device 1. Further, a channel region 71 is arranged between the first and second gate regions 71, 72 and is connected to the gate and source electrode 83 through a source region 61.

The gate and source electrode 83 that connects the first gate region 71 with the second gate region 72 provides for the electrical connection between the gate terminal and the source terminal (as illustrated in FIGS. 1, 3 and 4) of the second transistor device 31. The gate and source electrode 83 forms the first load terminal (source terminal) S31 of the second transistor device 31 or is connected to the second load terminal S31.

Like in the channel region 51 of the first transistor device 1, the channel region 62 of the second transistor device 31 extends essentially horizontally in the source region 61 and the drift region 63. This channel region includes or does not include a conducting channel dependent on a voltage between the drain and gate electrode 83 and the source region 64 (the source terminal S31).

Like the first transistor device 1, the second transistor device may be implemented as an n-type JFET. In this case, the source region 61, the channel region 71, the drift region 63, and the drain region 64 are n-type semiconductor regions, while the first and second gate regions 71, 72 are p-type semiconductor regions.

The operating principle of the second transistor device 31 is explained in the following. Just for explanation purposes it is assumed that the second transistor device is an n-type JFET. However, the operating principle is similar in a p-type JFET. When a positive voltage is applied between the drain and source terminals D31, S31 (corresponding to a positive drain-source voltage $V_{DS31}$ explained with reference to FIGS. 1 and 2) a positive current flows through second transistor 31. This current causes a voltage drop along the channel region 71 where this voltage drop increases as the current increase. The voltage along the channel region causes the pn-junction between the channel region 71 and the gate regions 71, 72 to be reverse biased, wherein a depletion region expanding from the pn-junction extends deeper into the channel region 71 as the reverse biasing voltage increases. Thus, the current is limited to the saturation current $I31_{SAT}$ explained with reference to FIG. 2.

When a negative voltage is applied between the drain and source terminals D31, S31 (corresponding to a negative drain-source voltage $V_{DS31}$ explained with reference to FIGS. 1 and 2) a negative current flows through second transistor 31. The pn-junctions between the gate regions 71, 72 and the channel region 71 is forward biased so that there is no current limitation in this case.

Optionally, one or both of the source electrode 81 of the first transistor device 1 and the gate and drain electrode 83 of the second transistor device 31 are connected to the corresponding second gate region 52, 72 and the drift region 43, 63 through a contact region 54, 74 (illustrated in dashed lines) with a doping concentration higher than the second gate region 52, 72.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
a first transistor device comprising a control terminal and a load path;
a drive circuit comprising an input terminal and an output terminal, the output terminal coupled to the control terminal of the first transistor device and the drive circuit operable to drive the first transistor device dependent on an input signal received at the input terminal; and
a polarity detector coupled in parallel with the load path of the first transistor device, the polarity detector comprising a second transistor device and a current detector, wherein
the second transistor device comprises a load path coupled to the load path of the first transistor device, and
the current detector comprises a sense path in series with the load path of the second transistor device and an output coupled to the input terminal of the drive circuit, the current detector operable to detect a current direction of a current through the second transistor device, to generate an on-level of the input signal when the current through the second transistor device has a predefined current direction, and not to affect a signal level of the input signal when the current through the second transistor has a current direction opposite the predefined current direction.

2. The electronic circuit of claim 1, wherein the second transistor device further comprises a control terminal coupled to the load path of the second transistor device.

3. The electronic circuit of claim 1, wherein the first transistor device and the second transistor device are transistors of the same transistor type.

4. The electronic circuit of claim 3, wherein the first transistor device is a JFET and the second transistor device is a JFET.

5. The electronic circuit of claim 4, wherein the first transistor device is an n-type JFET and the second transistor device is an n-type JFET.

6. The electronic circuit of claim 3, wherein the first transistor device is a HEMT and wherein the second transistor device is a HEMT.

7. The electronic circuit of claim 5,
wherein both the first transistor device and the second transistor device comprise a gate terminal, a source terminal and a drain terminal; and
wherein the gate terminal of the second transistor device is coupled to the source terminal of the second transistor device and wherein the drain terminal of the second transistor device is coupled to the drain terminal of the first transistor device.

8. The electronic circuit of claim 1, wherein the first transistor device and the second transistor device are integrated in a common semiconductor body.

9. The electronic circuit of claim 1, wherein the current detector comprises a third transistor device with a control current path and a load current path, the control current path coupled in series with the load path of the second transistor device and the load current path coupled between the input terminal of the drive circuit and a terminal for an on-level.

10. The electronic circuit of claim 9, wherein the terminal for the on-level is a first load terminal of the first transistor device or a terminal of a voltage source coupled to the first load terminal of the first transistor device.

11. The electronic circuit of claim 9,
wherein the third transistor device is a bipolar junction transistor; and
wherein the control current path is a base-emitter path and the load current path is a collector-emitter path of the bipolar junction transistor.

12. The electronic circuit of claim 11, wherein the bipolar junction transistor is a PNP transistor.

13. A method of operating an electronic circuit, the method comprising:
switching a conduction transistor with a first conduction path on and off in order to control current flowing in a first direction through the first conduction path using a drive circuit;
detecting a reverse polarity in the first conduction path using a polarity detector, wherein the polarity detector has a second conduction path in parallel with the first conduction path; and
overriding an input to the drive circuit to switch the conduction transistor on when a reverse polarity is detected, wherein the reverse polarity comprises a voltage opposite to a voltage inducing the current flowing in the first direction.

14. The method of claim 13, wherein the method further comprises conducting a current in a second direction through the first conduction path when the input to the drive circuit is overridden.

15. The method of claim 13, wherein the polarity detector comprises a second transistor coupled in series with a current detector, and wherein the current detector is configured to detect the reverse polarity and override the input to the drive circuit.

16. An electronic circuit comprising:
a first transistor comprising a gate, a first conduction terminal coupled to a first load terminal, and a second conduction terminal coupled to a second load terminal;
a drive circuit comprising an input terminal configured to receive a control signal from a control circuit and an output terminal coupled to the gate of the first transistor;
a second transistor comprising a first conduction terminal coupled to the first conduction terminal of the first transistor, a second conduction terminal, and a gate electrically coupled to the second conduction terminal and not coupled to the output terminal of the drive circuit; and
a current detector comprising a first conduction terminal coupled to the second conduction terminal of the second transistor, a second conduction terminal coupled to the second conduction terminal of the first transistor, and a control signal terminal coupled to the input terminal of the drive circuit.

17. The electronic circuit of claim 16, wherein the drive circuit comprises a third transistor and a fourth transistor, wherein control terminals of the third transistor and the fourth transistor are coupled to the input terminal of the drive circuit and conduction paths of the third transistor and the fourth transistor are coupled in series between a first supply voltage and a second supply voltage.

18. The electronic circuit of claim 16, wherein the current detector comprises a bipolar junction transistor (BJT) having a primary conduction path coupled between the input terminal of the drive circuit and a reference voltage and having a base terminal coupled to the second conduction terminal of the second transistor.

19. The electronic circuit of claim 18, wherein the BJT of the current detector comprises a PNP BJT with an emitter coupled to the reference voltage and a collector coupled to the input terminal of the drive circuit.

20. The electronic circuit of claim 16, wherein the first and second transistors are JFETs.

21. The electronic circuit of claim 16, wherein first and the second transistors are integrated in a common semiconductor body.

22. An electronic circuit, comprising:
a first transistor device comprising a control terminal and a load path;
a drive circuit comprising an input terminal and an output terminal, the output terminal coupled to the control terminal of the first transistor device and the drive circuit operable to drive the first transistor device to conduct current in a first direction dependent on an input signal received at the input terminal; and
a polarity detector coupled in parallel with the load path of the first transistor device, the polarity detector comprising a second transistor device and a current detector, wherein
the second transistor device comprises a load path coupled to the load path of the first transistor device and a control terminal electrically coupled to the load path of the second transistor device, and the current detector comprises a sense path in series with the load path of the second transistor device and an output coupled to the input terminal of the drive circuit, the current detector operable to override the input signal received at the input terminal in order to drive the first transistor device to a conducting state when a reverse polarity is detected in the sense path, wherein the reverse polarity comprises a voltage opposite to a voltage inducing current flow in the first direction in the first transistor device.

* * * * *